United States Patent
Son et al.

(10) Patent No.: US 6,943,438 B2
(45) Date of Patent: Sep. 13, 2005

(54) MEMORY CARD HAVING A CONTROL CHIP

(75) Inventors: Min-Young Son, Chungcheongnam-do (KR); Se-Yong Oh, Kyungki-do (KR); Tae-Gyeong Chung, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/355,448

(22) Filed: Jan. 31, 2003

(65) Prior Publication Data

US 2003/0197261 A1 Oct. 23, 2003

(30) Foreign Application Priority Data

Apr. 20, 2002 (KR) ........................................ 2002-21786

(51) Int. Cl.[7] .............................................. H01L 23/28
(52) U.S. Cl. ..................... 257/679; 257/685; 257/686; 257/723; 257/777; 257/787; 257/788; 257/790; 257/724; 257/727; 257/783
(58) Field of Search ................................ 257/679, 777, 257/686, 685, 723, 784, 786, 727, 783

(56) References Cited

U.S. PATENT DOCUMENTS

| | | | |
|---|---|---|---|
| 4,947,234 A | 8/1990 | Einzinger et al. | |
| 5,012,323 A | 4/1991 | Farnworth et al. | |
| 5,376,825 A | 12/1994 | Tukamoto et al. | |
| 6,271,598 B1 * | 8/2001 | Vindasius et al. | 257/777 |
| 6,351,028 B1 * | 2/2002 | Akram | 257/686 |
| 6,503,776 B2 * | 1/2003 | Pai et al. | 438/106 |
| 2002/0030262 A1 * | 3/2002 | Akram | 257/686 |
| 2003/0015803 A1 * | 1/2003 | Prietzsch | 257/777 |
| 2003/0029920 A1 * | 2/2003 | Chhor et al. | 235/492 |
| 2003/0030151 A1 * | 2/2003 | Morozumi | 257/777 |
| 2003/0155659 A1 * | 8/2003 | Verma et al. | 257/777 |
| 2003/0209793 A1 * | 11/2003 | Nishizawa et al. | 257/679 |
| 2004/0106231 A1 * | 6/2004 | Wang | 438/108 |
| 2004/0121521 A1 * | 6/2004 | Jackson et al. | 438/108 |

FOREIGN PATENT DOCUMENTS

JP        2001-217383        10/2001

* cited by examiner

*Primary Examiner*—Alexander Oscar Williams
(74) *Attorney, Agent, or Firm*—Marger Johnson & McCollom, P.C.

(57) ABSTRACT

In one embodiment, a memory card comprises a card substrate, at least one memory chip attached to the card substrate, a control chip mounted on the memory chip, bonding wires electrically connecting the chips with the card substrate, a passive device attached to the card substrate near the memory chip, and a molded body encapsulating the memory chip, the control chip, the bonding wires and the passive device. In addition, the memory card comprises an adhesive spacer interposed between the same-sized chips to secure a wire loop of the bonding wires.

8 Claims, 5 Drawing Sheets

MEMORY CARD HAVING A CONTROL CHIP

RELATED APPLICATION

This application relies for priority upon Korean Patent Application No. 2002-21786, filed on Apr. 20, 2002, the contents of which are herein incorporated by reference in their entirety.

BACKGROUND OF THE INVENTION

1. Field of the Invention

The present invention relates to semiconductor devices and, more particularly, to a memory card used as data storage media.

2. Description of the Related Art

A multimedia card (MMC) is one of new memory cards for use with portable electronic devices. Such a memory card employs a control device and a memory device, both of which are mounted on and electrically connected to a printed circuit board or a card substrate, using a wire bonding process. The MMC is protected from an external environment using encapsulating structures formed by a molding process, a capping process, or both.

Figure 1:
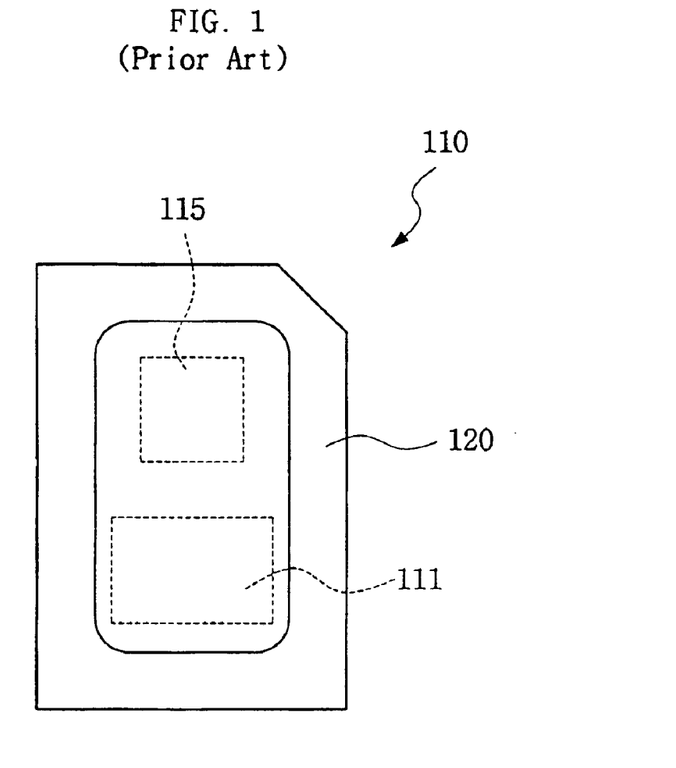
FIG. 1 is a plan view of a conventional memory card.
Figure 2A:
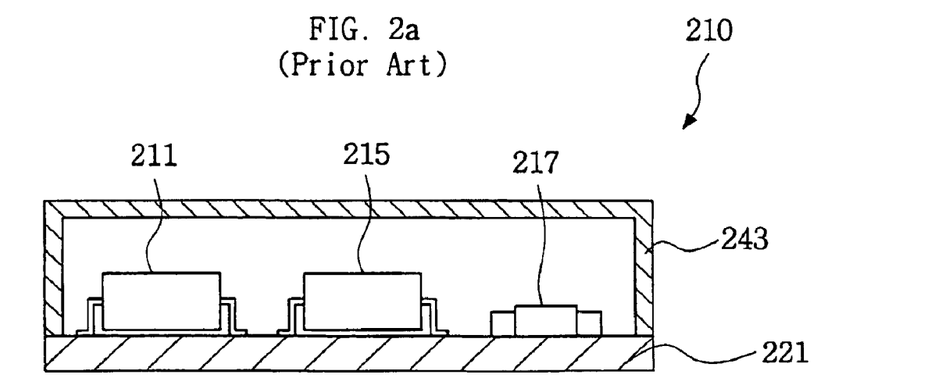
FIGS. 2a to 2c are cross-sectional views showing conventional memory cards.
Figure 2B:
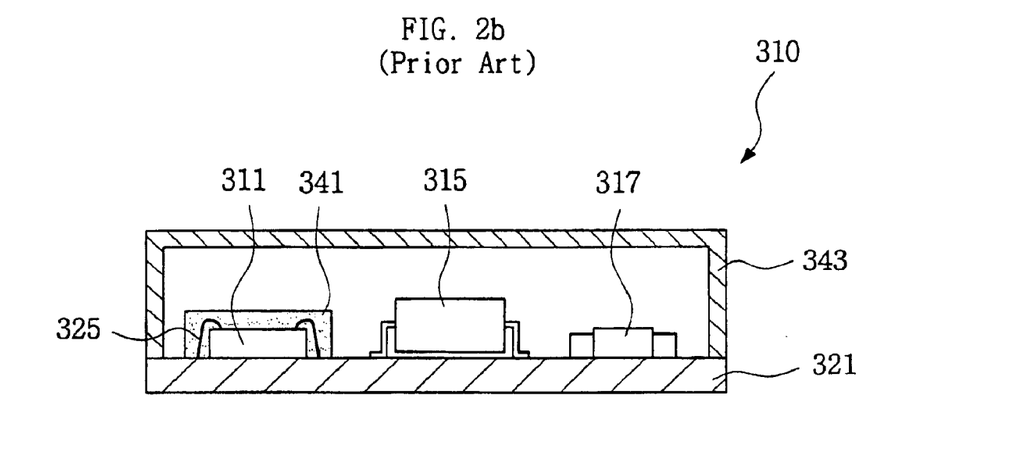
Figure 2C:
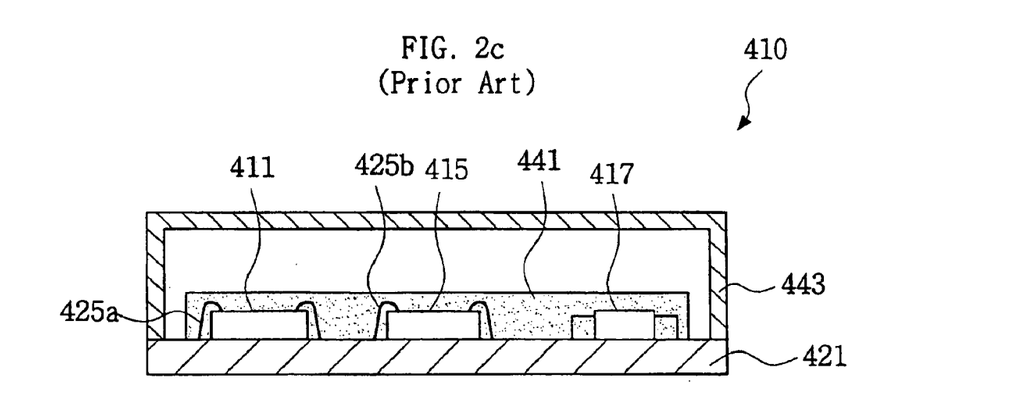

FIG. 1 is a plan view of a conventional memory card. FIGS. 2a to 2c are cross-sectional views of the conventional memory cards.

In the conventional memory card 110, a memory device 111 and a control device 115 are mounted on a card substrate 120 and encapsulated as shown in FIG. 1. The conventional memory cards can be classified into three different types depending on their inner structures as discussed below.

FIG. 2a shows a conventional memory card 210, in which a packaged memory device 211, a packaged control device 215 and a passive device 217 are mounted on a card substrate 221 and then encapsulated with a lid 243.

FIG. 2b shows another conventional memory card 310, in which a bare (non-packaged) memory device 311 is mounted on and electrically connected to a card substrate 321 through a bonding wire 325 and encapsulated with a molded body 341. Like the memory card 210 of FIG. 2a, a packaged control device 315 and a passive device 317 are mounted on the card substrate 321. Finally, the devices 311, 315 and 317 are all encapsulated with a lid 343.

FIG. 2c shows yet another conventional memory card 410, in which a non-packaged memory device 411 and a non-packaged control device 415 are mounted on and electrically connected to a card substrate 421 through bonding wires 425a and 425b, respectively. All of the devices 411, 415 and 417 are protected by both a molded body and a lid.

As mentioned above, the memory device and the control device are any of packaged or non-packaged and mounted on the card substrate in a two-dimensional arrangement. If the memory device and the control device are assembled into packages, a surface mounting technology (SMT) is used to interconnect the devices with the card substrate. If the devices are bare chips, i.e., not assembled into packages, a wire bonding technology is used to interconnect the devices with the card substrate. Either way, each device is finally capped with the lid to be protected from an external environment to improve the reliability.

Such conventional memory cards are manufactured by mounting the memory device and the control device on the card substrate and then capping the devices with the lid. While the packaged devices can be simply surface-mounted, the bare chips need to be wire-bonded and encapsulated with a molding compound between the mounting and the capping steps.

The conventional memory card is, however, limited in its ability to increase memory capacity and to reduce size due to its two-dimensional arrangement. Also, because the devices within the conventional memory card are protected by both the lid 443 and the molded body 417, manufacturing process steps are complicated and manufacturing costs are increased.

SUMMARY OF THE INVENTION

In accordance with an embodiment of the present invention, a memory card comprises a card substrate, at least one memory chip attached to the card substrate, a control chip mounted on the memory chip, bonding wires electrically connecting the chips with the card substrate, a passive device attached to the card substrate near the memory chip, and a molded body encapsulating the memory chip, the control chip, the bonding wires and the passive device. This structure allows the memory density on the memory card to increase and also allows a reduction in package sizes. Further, because a conventional lid-capping process is not required, a manufacturing process can be simplified and manufacturing costs can be reduced.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and, in which.

DETAILED DESCRIPTION OF THE PREFERRED EMBODIMENTS

The present invention now will be described more fully with reference to the accompanying drawings. It should be noted, however, that the present invention may be embodied in many different forms and should not be construed as being limited to the specific embodiments set forth herein. Rather, these embodiments are provided by way of example only.

Figure 3:
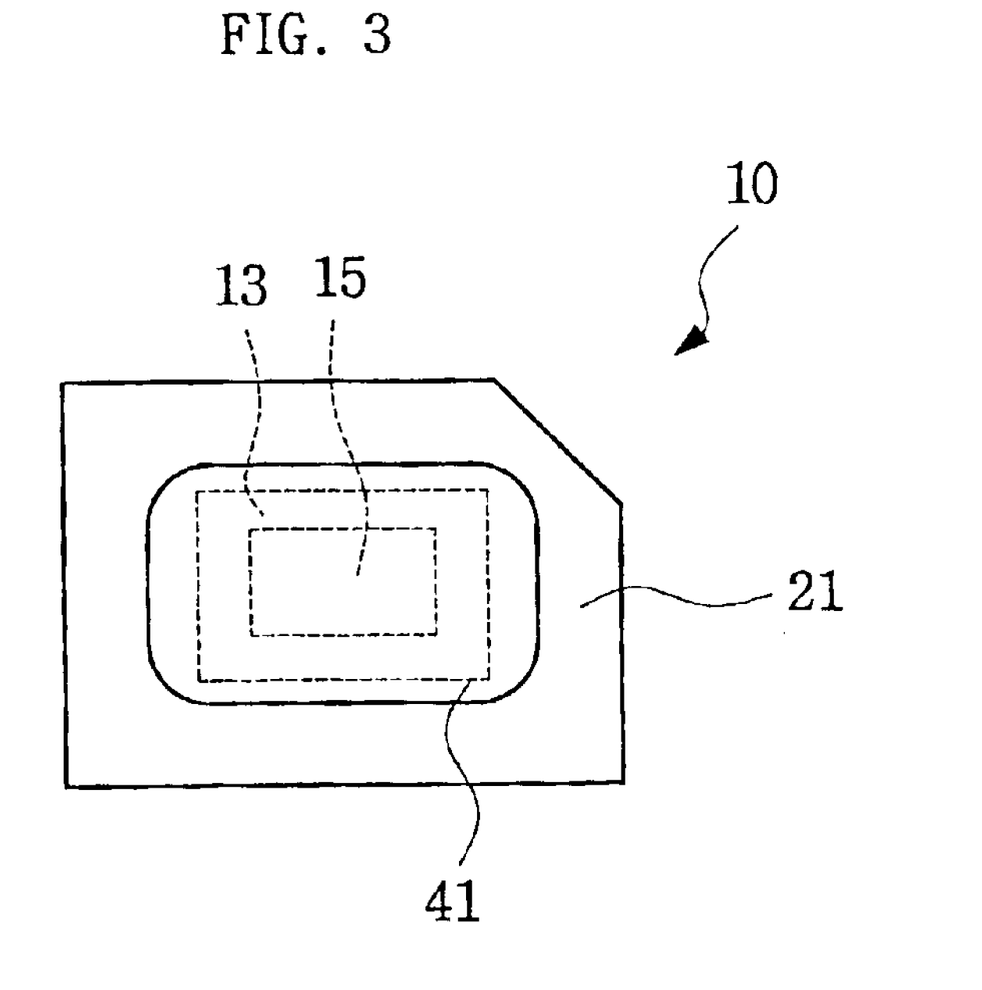
FIG. 3 is a plan view of a memory card in accordance with an embodiment of the present invention.

FIG. 3 is a plan view of a memory card in accordance with an embodiment of the present invention. FIG. 4f is a cross-sectional view of a memory card according to an embodiment of the present invention.

Referring to FIG. 4f, a memory card 10 comprises lower and upper memory chips 11 and 13 stacked on a card substrate 21, a control chip 15 mounted on the upper memory chip 13, and a passive device 17 attached to the card substrate 21 adjacent the memory chips 11 and 13. The lower memory chip 11 and the upper memory chip 13 are preferably the same types of memory devices and have peripheral bonding pads in which bonding pads 12 and 14 are disposed along the periphery of the top surface of the chips 11 and 13.

The lower memory chip 11 is attached to the card substrate 21 using a first adhesive 31. The first adhesive 31 can be any conventional adhesive suitable for implementing the present invention. The upper memory chip 13 is attached to the lower memory chip 11 using an adhesive spacer 33 having a predetermined thickness so that the upper memory chip 13 is spaced away from the lower memory chip 11. The control chip 15 is mounted on the upper memory chip 13 through a second adhesive 35. The second adhesive 35 may be replaced with an adhesive spacer if the control chip is of the same size as the memory chips 111 and 13. Various types of adhesives may be used for the adhesive spacer 33. For example, the spacer may have a base layer having a thickness and top and bottom adhesive layers on and under the base layer.

The memory chips 11 and 13 and the control chip 15 are electrically connected to the card substrate 21 through bonding wires 25. A wire loop of the bonding wire 25 is sufficiently secured through the use of the adhesive spacer 33. A molded body 41 comprises insulative encapsulation materials such as epoxy molding compound and encapsulates a top portion of the card substrate 21, such as the memory chips 11 and 13, the control chip 15, the passive device 17 and the bonding wires 25. The molded body 41 protects the top portion of the card substrate 21 from an external environment.

Hereinafter, a method for manufacturing a memory card according to an embodiment of the present invention is described. FIGS. 4a to 4f are cross-sectional views showing a method for manufacturing a memory card in accordance with an embodiment of the present invention.

Figure 4A:
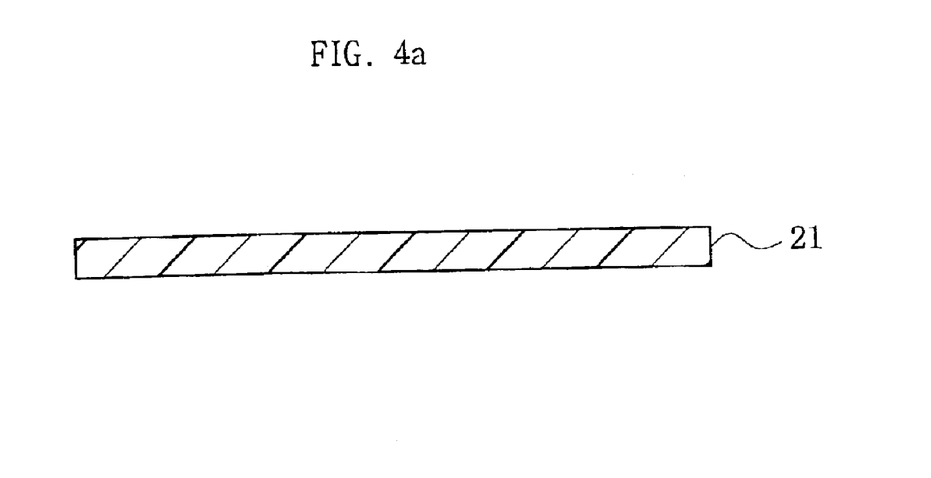
FIGS. 4a to 4f are cross-sectional views illustrating a process for manufacturing a memory card in accordance with an embodiment of the present invention.

Referring to FIG. 4a, the card substrate 21 is provided. The card substrate 21 has circuit patterns, but not shown for clarity.

Figure 4B:
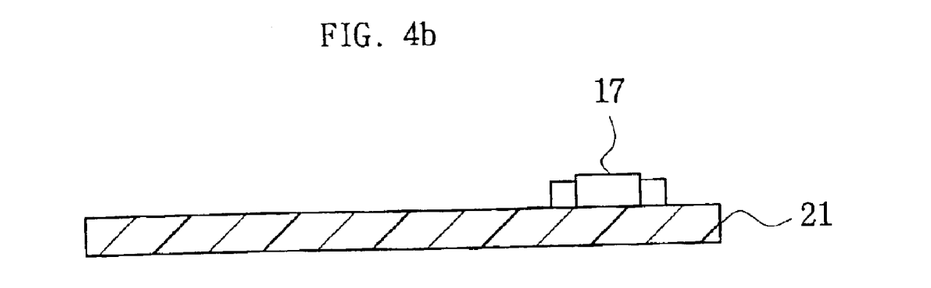

Referring to FIG. 4b, the passive device 17 such as a capacitor or a resistor is attached to the card substrate 21.

Figure 4C:
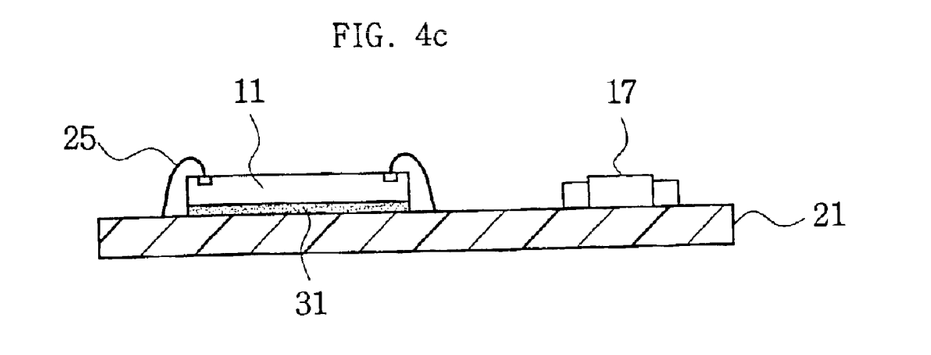

Turning to FIG. 4c, the lower memory chip 11 is attached to the card substrate 21 using the first adhesive 31 and wire-bonded to the card substrate 21.

Figure 4D:
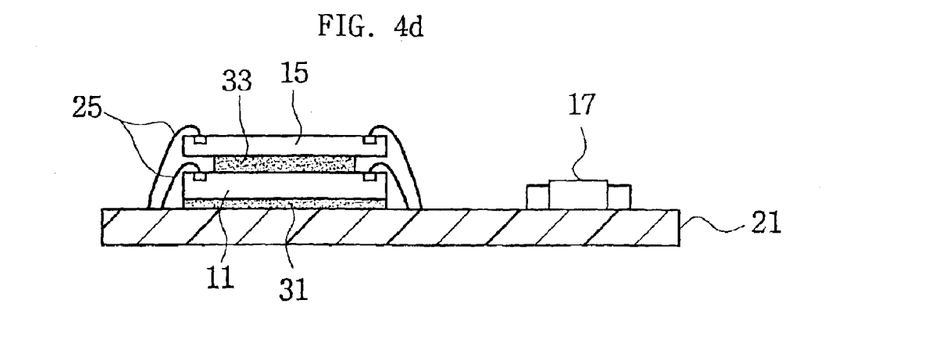

Referring to FIG. 4d, the upper memory chip 13 is then attached to the lower memory chip 11 using the first adhesive spacer 33 having a predetermined thickness and wire-bonded to the card substrate 21.

Figure 4E:
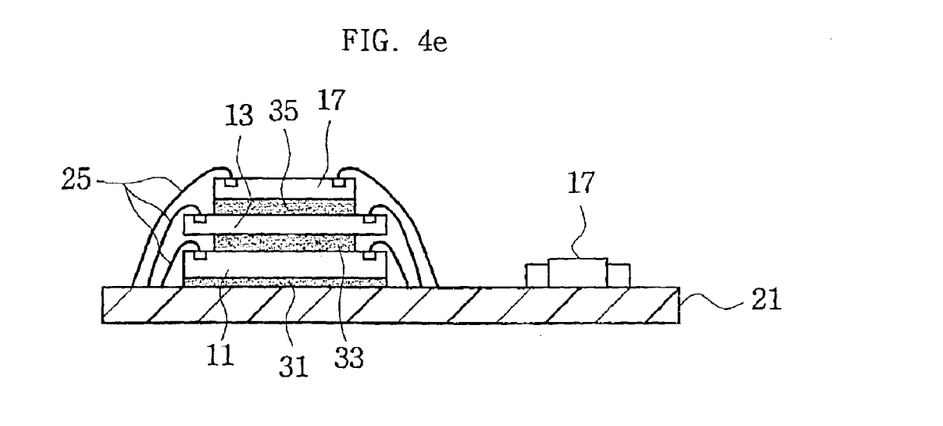
Figure 4F:
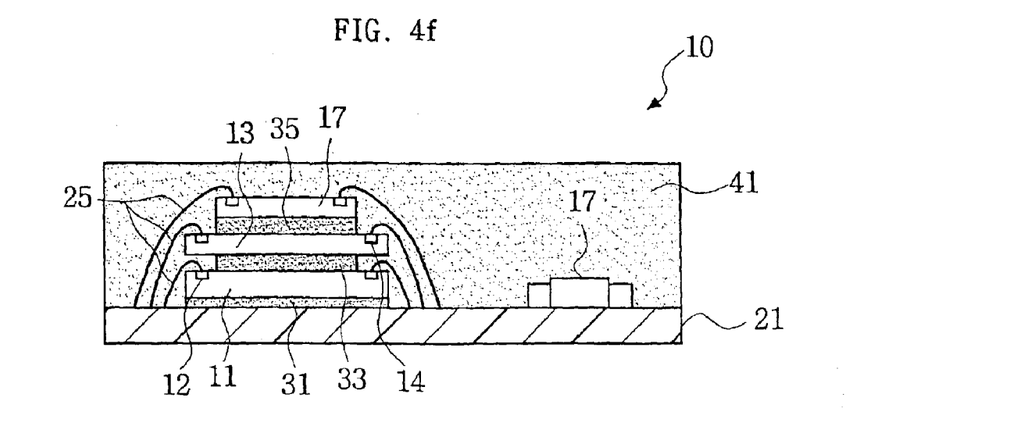

Referring to FIG. 4e, the control chip 15 is attached to a top surface of the upper memory chip 13 using the second adhesive 35 and wire-bonded to the card substrate 21.

Referring to FIG. 4f, the molded body 41 is formed to cover the passive device 17, the memory chips 11 and 13 and the control chip 15.

As described above in the embodiment, the memory card in accordance with the present invention does not have a two-dimensional arrangement but a three-dimensional arrangement, in which the non-packaged memory device and the non-packaged control device are vertically stacked. This increases memory capacity and reduces the size of packages. For example, the present invention can reduce the conventional memory card having a dimension of 32×24 mm to 18×24 mm. Furthermore, the use of the non-packaged chips can reduce the thickness. Thus, a smaller memory card can be obtained.

Additionally, the memory card of the present invention employing memory chips having peripheral pads reduces the length of the bonding wire, thereby improving the reliability of the wire bonding process. Because the wire loop height of the bonding wire can be secured sufficiently by the adhesive spacers, it is possible to stack different and/or the same types of memory chips. The memory chips, the control chip and the passive device are protected together in a molded body without having to use a separate lid. Therefore, an additional process for attaching the lid is not required, reducing manufacturing costs.

Although the preferred embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. A memory card comprising:
    a card substrate;
    at least one memory chip attached to the card substrate;
    a control chip vertically stacked on the memory chip, wherein the chips are electrically connected with the card substrate; and
    a passive device attached to the card substrate near the memory chip; and
    a molded body encapsulating the memory chip, and the control chip and the passive device.

2. The memory card of claim 1, wherein the devices are electrically connected with the card substrate using a plurality of bonding wires.

3. The memory card of claim 1, further comprising an adhesive interposed between the memory chip and the control chip.

4. The memory card of claim 1, wherein the memory chip includes a lower memory chip attached to the card substrate and an upper memory chip vertically stacked on the lower memory chip.

5. The memory card of claim 4, further comprising an adhesive spacer interposed between the lower memory chip and the upper memory chip.

6. The memory card of claim 4, wherein the memory chips comprise the same type of memory device.

7. The memory card of claim 1, wherein the memory chip has a plurality of bonding pads disposed along a periphery of a top surface thereof.

8. The memory device of claim 1, wherein the memory card does not include a lid.

* * * * *

UNITED STATES PATENT AND TRADEMARK OFFICE
CERTIFICATE OF CORRECTION

PATENT NO. : 6,943,438 B2  
APPLICATION NO. : 10/355448  
DATED : September 13, 2005  
INVENTOR(S) : Min-Young Son et al.

It is certified that error appears in the above-identified patent and that said Letters Patent is hereby corrected as shown below:

Replace sheet 5 of 5 with attached sheet.

At Column 1, Line 53, please insert --441-- after "a molded body"; and please insert --443-- after "a lid".

At Column 2, Line 9, please delete "417" and insert --441--.

At Column 2, Line 58, please delete "II" and insert --11--.

At Column 3, Line 9, please delete "111" and insert --11--.

Signed and Sealed this

Thirty-first Day of October, 2006

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 6,943,438 B2 | Page 1 of 1 |
| APPLICATION NO. | : 10/355448 | |
| DATED | : September 13, 2005 | |
| INVENTOR(S) | : Son et al. | |

It is certified that error appears in the above-identified patent and that said Letters Patent is hereby corrected as shown below:

On the Title Page, at item 54, please replace "MEMORY CARD HAVING A CONTROL CHIP" with --MEMORY CARD--

At column 1, line 1, please replace "MEMORY CARD HAVING A CONTROL CHIP" with --MEMORY CARD--

At column 2, line 58, please replace "chips II" with --chips 11--

At column 3, line 9, please replace "chips 111" with --chips 11--

Signed and Sealed this

Twelfth Day of December, 2006

JON W. DUDAS
*Director of the United States Patent and Trademark Office*